(12) United States Patent
Cranford, Jr. et al.

(10) Patent No.: US 7,268,613 B2
(45) Date of Patent: Sep. 11, 2007

(54) TRANSISTOR SWITCH WITH INTEGRAL BODY CONNECTION TO PREVENT LATCHUP

(75) Inventors: Hayden C. Cranford, Jr., Cary, NC (US); Stacy J. Garvin, Durham, NC (US); Todd M. Rasmus, Cary, NC (US)

(73) Assignee: International Business Machines Corporation, Armonk, NY (US)

( * ) Notice: Subject to any disclaimer, the term of this patent is extended or adjusted under 35 U.S.C. 154(b) by 60 days.

(21) Appl. No.: 11/263,008

(22) Filed: Oct. 31, 2005

(65) Prior Publication Data

US 2007/0096792 A1  May 3, 2007

(51) Int. Cl.
*G05F 3/02* (2006.01)
(52) U.S. Cl. .................. 327/537; 327/389; 327/427
(58) Field of Classification Search ............... None
See application file for complete search history.

(56) References Cited

U.S. PATENT DOCUMENTS

| | | | | |
|---|---|---|---|---|
| 5,160,855 | A | * | 11/1992 | Dobberpuhl ............... 327/108 |
| 5,434,526 | A | * | 7/1995 | Tanigashira et al. ........ 327/389 |
| 5,510,747 | A | * | 4/1996 | Williams ................... 327/434 |
| 5,689,209 | A | * | 11/1997 | Williams et al. ............ 327/425 |
| 5,760,447 | A | | 6/1998 | Tsuboi |
| 5,767,733 | A | * | 6/1998 | Grugett ..................... 327/534 |
| 6,111,455 | A | * | 8/2000 | Eleyan et al. .............. 327/537 |
| 6,194,952 | B1 | * | 2/2001 | Shigehara ................... 327/534 |
| 6,335,653 | B1 | * | 1/2002 | Shigehara et al. ........... 327/534 |
| 6,404,269 | B1 | * | 6/2002 | Voldman ..................... 327/534 |
| 6,429,684 | B1 | * | 8/2002 | Houston ...................... 326/83 |
| 6,628,159 | B2 | * | 9/2003 | Voldman ..................... 327/534 |
| 6,844,597 | B2 | | 1/2005 | Baird et al. |
| 7,095,266 | B2 | * | 8/2006 | Miske ........................ 327/427 |
| 2001/0008477 | A1 | | 7/2001 | Sakamoto et al. |
| 2002/0195623 | A1 | * | 12/2002 | Horiuchi ..................... 257/200 |
| 2004/0262643 | A1 | | 12/2004 | Voldman |

FOREIGN PATENT DOCUMENTS

JP  7302250  11/1995

* cited by examiner

*Primary Examiner*—Tuan T. Lam
*Assistant Examiner*—William Hernandez
(74) *Attorney, Agent, or Firm*—Josh G. Cockburn; Dillon & Yudell LLP

(57) ABSTRACT

A circuit device having a transistor-based switch topology that substantially eliminates the possibility of latchup of the device. A series-connected low voltage threshold (LVT) N-channel transistor and a pull-up resistor are coupled across a switching (P-channel) transistor so that an integral body connection is provided for the switching transistor, which connects the body of the switching transistor to a node between the pull-up resistor and source terminal of the LVT transistor. The LVT transistor is connected with its gate and drain terminal connected to the output terminal of the switching transistor. The resistor is connected at its other end to the power supply side terminal of the switching transistor. The addition of these components in the particular configuration allows the body connection of the switching transistor to be automatically switched to the highest potential diffusion node.

18 Claims, 5 Drawing Sheets

NORMAL MODE

TEST MODE

TRANSISTOR SWITCH WITH INTEGRAL BODY CONNECTION TO PREVENT LATCHUP

BACKGROUND OF THE INVENTION

1. Technical Field

The present invention relates generally to electrical circuits and in particular to use of transistor switches within electrical circuits. Still more particularly, the present invention relates to preventing latchup of transistor switches.

2. Description of the Related Art

Electrical switches are generally known in the art. FIG. 1A illustrates a conventional switch configuration, comprising a power supply 105 coupled via a switch 115 to a load 125. Power supply 105 and load 125 are in turn both connect to ground (GND) 120. A majority of electrical switches are implemented utilizing a transistor connected between the power source and the load. FIG. 2A illustrates one such switch configuration in which transistor 215 operates as the switch and is connected to output load impedance (referred to herein as ZL 225). Transistor 215 is switched on/off by applying/removing a gate voltage (gate 240) across the transistor's gate/source. During normal operation, when transistor 215 is turned on, transistor 215 exhibits certain operational characteristics that enable forward current flow from power supply 205 to ZL 225, generating a voltage across ZL 225. When transistor is turned off, however, no forward current flow passes through transistor 215 and thus, no current flow is expected through ZL 225.

One requirement for correct operation of P-channel transistors (and in particular those utilized in the above-described switch configuration) is that the transistor's body always be connected to the highest potential terminal of the two transistor terminals connecting the transistor to the circuit. Thus, as shown in FIG. 2A, transistor's body is connected (hard wired) to the power supply side terminal, which typically represents the terminal at the highest potential. The polarity of "VS1" indicates that the highest potential is at the side of the power supply terminal.

While the above configuration works in theory, since the transistor's body is biased to be always connected to the power supply side terminal, there are some implementations in which this configuration does not result in the transistor's body actually being connected to the highest potential terminal. For example, when transistor switches are utilized within inverter circuits, T-switches, and other such devices, the operation of the device occasionally results in higher potentials existing at the terminal not connected to the body of the transistor. Certain operational characteristics at the load end of the circuit device, such as reflections in transmission lines, for example, may result in a voltage across ZL that exceeds the potential seen at the power supply side terminal of the transistor. When this occurs, parasitic PN junctions within the transistor become forward biased and negatively affect the switching capability of the transistor and ultimately the device. This undesirable phenomenon is referred to as latch-up. A description of latch-up in transistor circuits/devices is provided in the background section of U.S. Pat. No. 6,878,595. Relevant portions of that description are incorporated herein by reference.

Thus, as mentioned above, latch-up may occur in the single switch configuration (described above). Additionally, one other type of circuit device in which latch-up is frequently encountered is the T-switch. During micro-circuit wafer or module testing, oftentimes switching between power domains is necessary. A conventional T-switch circuit design utilized for testing is illustrated within the circuit diagrams of FIG. 1B and 1C. As shown, two power supplies, primary supply 105 and secondary supply 110, are connected via switches 115/120 to load 125. Both power supplies provide power to a load 125, which is connected to one of the respective power supplies when a corresponding switch (switch1 115 for primary supply 105 and switch2 120 for secondary supply 110) is closed. Each leg of the circuit is connected to ground (GND) 130.

The two modes of operation of circuit 100 are illustrated. In normal mode, switch 1115 is closed, while switch2 120 is open, connecting load 125 to primary supply 105. During test mode, the state of the switches are reversed, i.e., switch2 120 is closed, while switch1 115 is open, whereby load 125 is connected to secondary supply 110.

FIG. 2B and 2C illustrates the transistor-enabled T-switch topology, which is well known in the art. With a conventional T-switch configured circuit, voltage across each switch may change polarity depending on the given switch state. As shown, the switches within a T-switch are two P-channel CMOS (complementary metal oxide semiconductor) transistors, switch1 transistor 215 and switch2 transistor 220, connected drain-to-drain in series with each other. A third transistor, N-channel transistor 235, connects at the drain-to-drain node of the two P-channel transistors. Each transistor receives a gate voltage input (Gate) 240, which turns switch1 and switch2 transistors 215, 220 off while N-channel transistor 235 is on, and vice versa. In this illustration, impedance ZL 225 represents the load being powered by either primary power supply 205 or secondary power supply 210 depending on whether the circuit is operating in normal or switched (test) mode.

With the above conventional circuit design, changing polarities across the T-switch may cause CMOS latchup exposure due to hard-wired body connections (shown connected to the positive voltage polarities (left and right, respectively) of switch1 transistor 215 and switch2 transistor 220. For normal operation, each P-channel transistor body should be tied toward the highest diffusion potentials, such that the voltage potential of the body of the transistor is not lower than that of the transistor's source or drain. This characteristic prevents forward biasing of the transistor's parasitic PN junction and the resulting latchup of the chip. For switched operation (when testing the wafer, for example), the P-channel body of switch2 transistor 120 becomes reversed-biased (change in voltage polarity) until the impedance (i.e., capacitance—C—within the load) is charged, risking potential latchup of the chip.

One proposed method of reducing the occurrence of latchup during the above described switching operations is by providing guard rings around the transistors. However, to substantially lower the risk for latchup, substantial guardringing is required, impacting the physical size (and cost) of the device (cell). Ultimately, the use of guard rings may not be sufficiently robust to prevent latchup.

SUMMARY OF THE INVENTION

Disclosed is a circuit device having a transistor-based switch topology that substantially eliminates the possibility of latchup of the device. A series-connected low voltage threshold (LVT) N-channel transistor and a pull-up resistor are coupled across a switching (P-channel) transistor so that an integral body connection is provided for the switching transistor, which connects the body of the switching transistor to a node between the pull-up resistor and source terminal of the LVT transistor. The LVT transistor is connected with its gate and drain terminal connected to the output terminal of the switching transistor. The resistor is connected at its other end to the power supply side terminal of the switching transistor. The addition of these components in the particular configuration allows the body connection of the switching transistor to be automatically switched to the highest potential diffusion node.

The LVT transistor is normally in an off state. When the switching transistor is in the "on" state, the pull-up resistor pulls the body connection of the switching transistor to the highest diffusion potential at the power supply side terminal. If the voltage at the output terminal rises above the body potential of the switching transistor, then the LVT transistor turns on and switches the body connection of the switching transistor to the high-side diffusion potential at the output terminal. The invention thus provides a means for dynamically switching the body connection of a CMOS-type transistor switch to the highest potential diffusion, while substantially eliminating (or achieving minimum) forward biasing of the switching transistor's parasitic PN junctions.

One embodiment provides a circuit device with multiple power domains across series-connected, transistor-based switches with integral body connections in which switching between power domains occurs without latchup of any of the transistor switches. This T-switch implementation operates in a normal state and a switch state. During the normal state of the device, LVT transistor is gated to an off state and the pull-up resistor pulls the body connection of the switching (P-channel) transistor to the high-side diffusion potential. When the device is in the switched state, however, the LVT transistor switches the body connection of the switching transistor to the high-side diffusion potential.

The above as well as additional objectives, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF AN ILLUSTRATIVE EMBODIMENT

The present invention provides a circuit device having a transistor-based switch topology that substantially eliminates the possibility of latchup of the device. A series-connected low voltage threshold (LVT) N-channel transistor and a pull-up resistor are coupled across a switching (P-channel) transistor so that an integral body connection is provided for the switching transistor, which connects the body of the switching transistor to a node between the pull-up resistor and source terminal of the LVT transistor. The LVT transistor is connected with its gate and drain terminal connected to the output terminal of the switching transistor. The resistor is connected at its other end to the power supply side terminal of the switching transistor. The addition of these components in the particular configuration allows the body connection of the switching transistor to be automatically switched to the highest potential diffusion node.

The LVT transistor is normally in an off state. When the switching transistor is in the "on" state, the pull-up resistor pulls the body connection of the switching transistor to the highest diffusion potential at the power supply side terminal. If the voltage at the output terminal rises above the body potential of the switching transistor, then the LVT transistor turns on and switches the body connection of the switching transistor to the high-side diffusion potential at the output terminal. The invention thus provides a means for dynamically switching the body connection of a CMOS-type transistor switch to the highest potential diffusion, while substantially eliminating (or achieving minimum) forward biasing of the switching transistor's parasitic PN junctions.

At the onset, it should be noted that while the various illustrative and described embodiments of the invention refer specifically to P-channel switches and circuit devices configured with P-channel switches, the description of P-channel switches is not meant imply any limitation on the invention. Thus, those skilled in the art appreciate that the features described herein are also applicable to N-channel switches and devices configured with N-channel switches. For example, implementation details of such an embodiment requires the body of the N-channel switch be connected to the lowest potential voltage (rather than the highest potential as provided in the embodiments described herein)

Figure 1A:
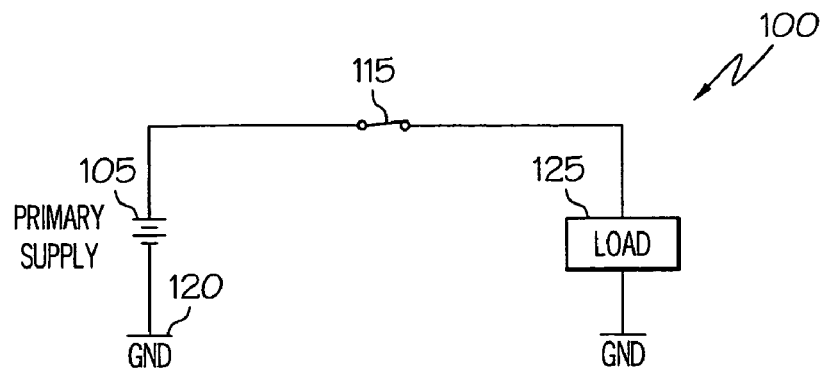
FIG. 1A provides a basic switch circuit in accordance with the prior art.
Figure 1B:
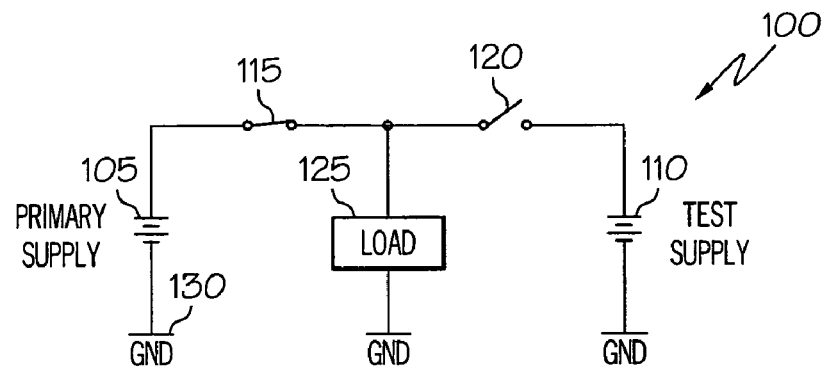
FIGS. 1B-1C illustrate a basic dual-switch test circuit in normal and switched mode, respectively, in accordance with the prior art.
Figure 1C:
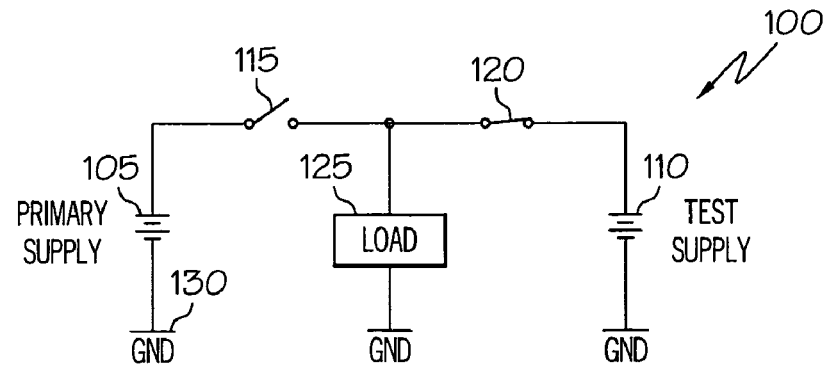
Figure 2A:
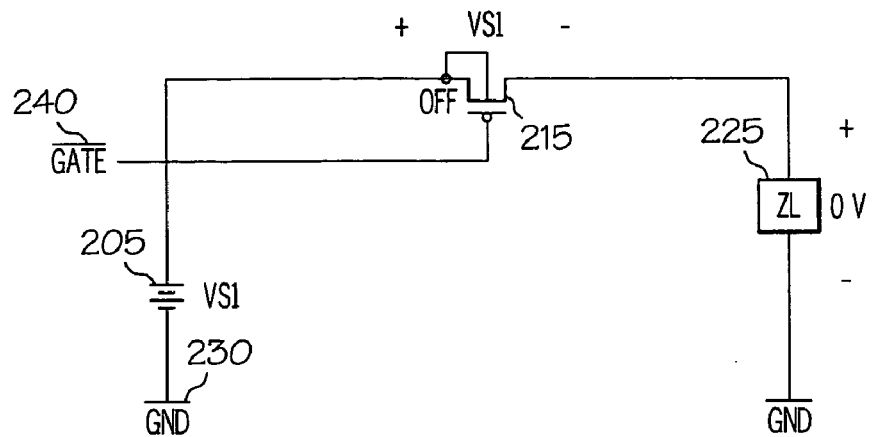
FIG. 2A illustrates basic switch circuit of FIG. 1A with the switching mechanism provided by a transistor according to prior art design.
Figure 2B:
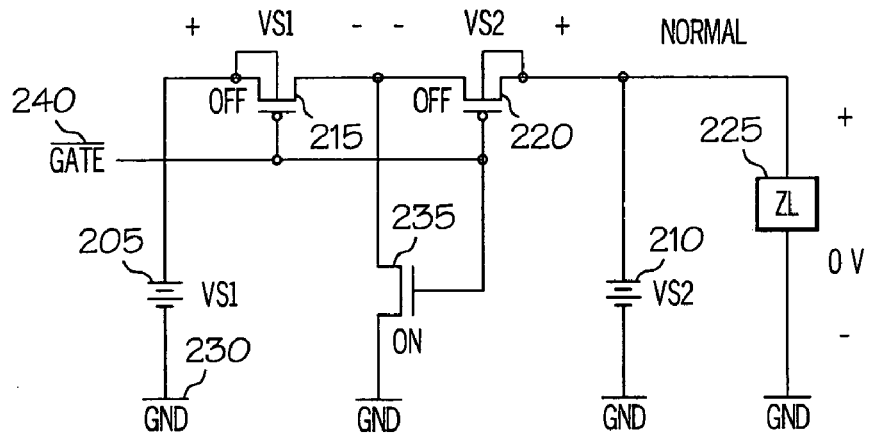
FIGS. 2B-2C illustrate internal transistor components of a basic T-switch test circuit in normal and switched mode, respectively, in accordance with the prior art.
Figure 2C:
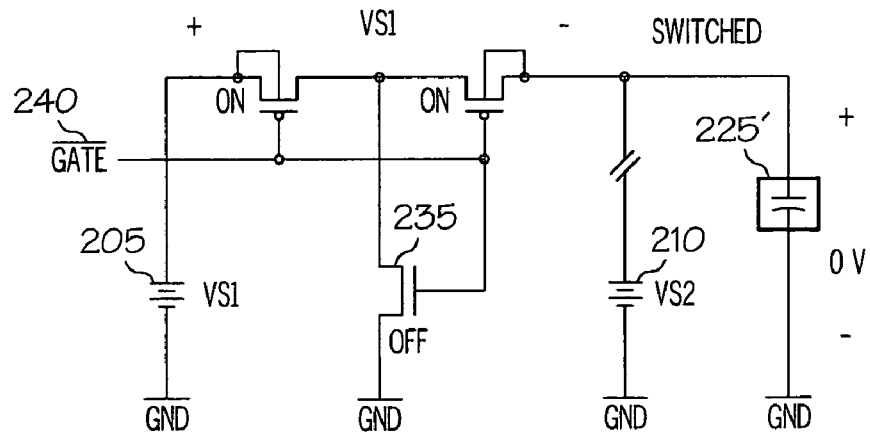
Figure 3A:
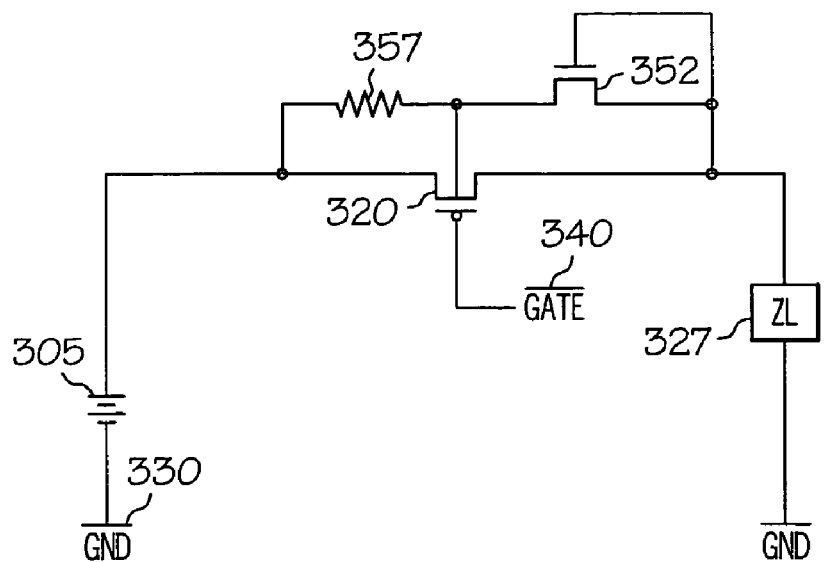
FIGS. 3A-3B respectively illustrates an enhanced switch configuration and enhanced T-switch configuration that both substantially reduce (and/or eliminate) latching effects in accordance with two embodiments of the present invention.

Referring now to FIG. 3A, there is illustrated an exemplary transistor switch configuration enhanced with the LVT transistor and resistor components to prevent latch-up of the device within which the switch is being utilized. For simplicity, the configuration is referred to hereinafter as an "enhanced switch" or "e-switch" for short. Enhanced switch 300 comprises the standard components found within a conventional switch design. Thus, e-switch 300 comprises switching transistor 320 (which is a P-channel CMOS transistor, in the illustrative embodiment) connected with its source (also referred to herein as the power supply side terminal) to power supply 305 and at its drain (or output terminal) to load/impedance (ZL) 327. Power supply 305 provides power across ZL 327 when switching transistor 320 is in an "on" state.

Each reference leg of the circuit is connected to ground (GND) 330. Switching transistor 320 receives gate voltage input (Gate input) 340, which turns switching transistor 320 off/on depending on the input received. In the illustrated embodiment, gate input 340 is required to turn switching transistor on and provide power supply voltage across ZL 327 (assuming voltage drop across switching transistor 320 is negligible). When gate input 340 is high (e.g., the same as the source potential), switching transistor 320 turns off.

In addition to these conventional components, e-switch 300 comprises a low voltage threshold (LVT) N-channel transistor 352 connected in series with a pull up resistor 357 across switching transistor 320. Drain terminal and gate terminal of LVT transistor 352 are connected to output terminal of switching transistor 320, while the source terminal is connected to both pull up resistor 357 and the body of switching transistor 320. Pull-up resistor 357 is connected at its other end to the power supply side terminal of switching transistor 320. LVT transistor 352 and pull up resistor 357 are added to e-switch configuration during fabrication of the wafer/chip to allow the body connection of switching transistor 320 to be switched between drain and source diffusions without latch-up, as described below.

Figure 4A:
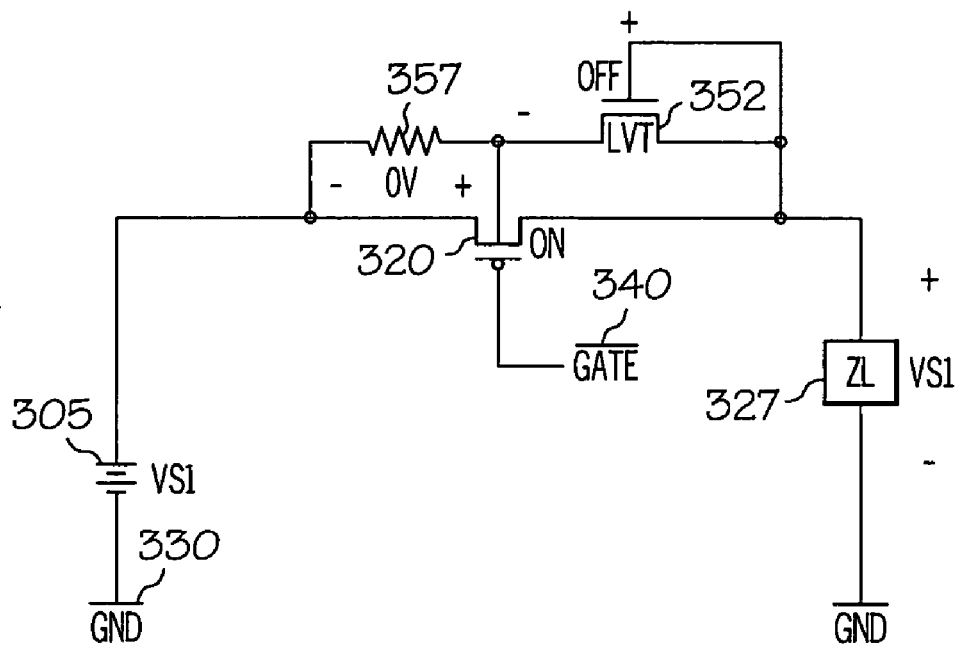
FIGS. 4A-4B illustrate the enhanced switch configuration of FIG. 3A in on and off operational mode, respectively, in accordance with embodiments of the invention.
Figure 4B:
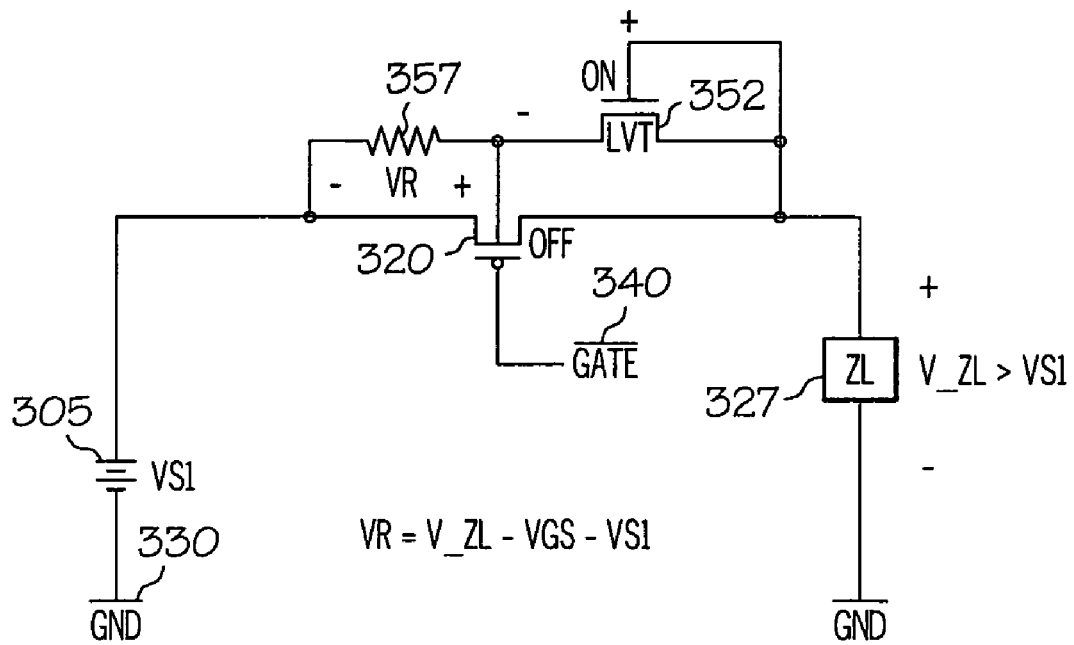

FIGS. 4A-4B illustrate the e-switch during on state operation and off state operation, respectively. LVT transistor 352 is normally in the "off" state. During on state, switching transistor 320 is on. Since the voltage drop across switching transistor 320 is low, pull-up resistor 357 and LVT transistor 352 also have little or no measurable voltage drop. Power supply voltage (VS1) is applied across ZL 327, and the body of switching transistor 320 is connected to high potential, power supply side terminal through pull-up resistor 357. Pull up resistor 357 pulls the body connection of switching transistor 320 to the high-side diffusion potential (of VS1). As shown by FIG. 4A, LVT transistor 352 is off and pull-up resistor 357 pulls the body of switching transistor 320 to the diffusion connected to power supply (VS1) 305. This potential represents the power-supply side potential.

During off state (i.e., when switching transistor 320 is in the off state), when/if a voltage drop across ZL 327 is greater than VS1 305, LVT transistor 352 automatically turns "on" and switches the body connection of switching transistor 320 to the high-side diffusion potential at the output terminal. As shown, LVT transistor 352 is turned on and connects the body of switching transistor 320 to the potential diffusion on the side of ZL 327. Automatically turning on LVT transistor 352 requires a load voltage (V_ZL) that is greater than the power supply voltage, VS1 305. In conventional switching circuits/devices, this may cause latch-up, as described in the background. With the present configuration of the e-switch, however, LVT transistor 352 automatically turns on whenever V_ZL is greater than VS1 305 and thus causes the body of switching transistor 320 to be connected to the side of switching transistor 320 with the highest diffusion potential.

As shown by FIG. 4B, a more accurate calculation of the voltage condition that causes LVT transistor 352 to turn on is: VR=V_ZL-VGS-VS1, where each voltage is represented within the figure. Thus, with the above described configuration, the e-switch prevents the occurrence of a higher voltage V_ZL (relative to VS1 305) from forward biasing the PN junctions of the switching transistor 320 and cause the device to latch up. LVT transistor 352 turns on whenever VGS is greater than the threshold voltage (Vt) for turning on the transistor. LVT transistor 352 thus clamps the voltage diffusion at the body of switching transistor 320 to a voltage level that prevents the body from ever being high enough to forward bias switching transistor's (320) parasitic PN junctions.

Enhanced T-Switch

One implementation of the invention is within a circuit device with multiple power domains across series-connected, transistor-based switches having integral body connections in which switching occurs between power domains. With this configuration, referred to within the art as a T-switch, it is important that the switching occurs between the power domains without latchup of any of the transistor switches. The described T-switch implementation provides a normal state and a switch state. During the normal state of the device, LVT transistor is gated to an off state and the pull-up resistor pulls the body connection of the switching (P-channel) transistor to the high-side diffusion potential. When the device is in the switched state, however, the LVT transistor switches the body connection of the switching transistor to the high-side diffusion potential.

Figure 3B:
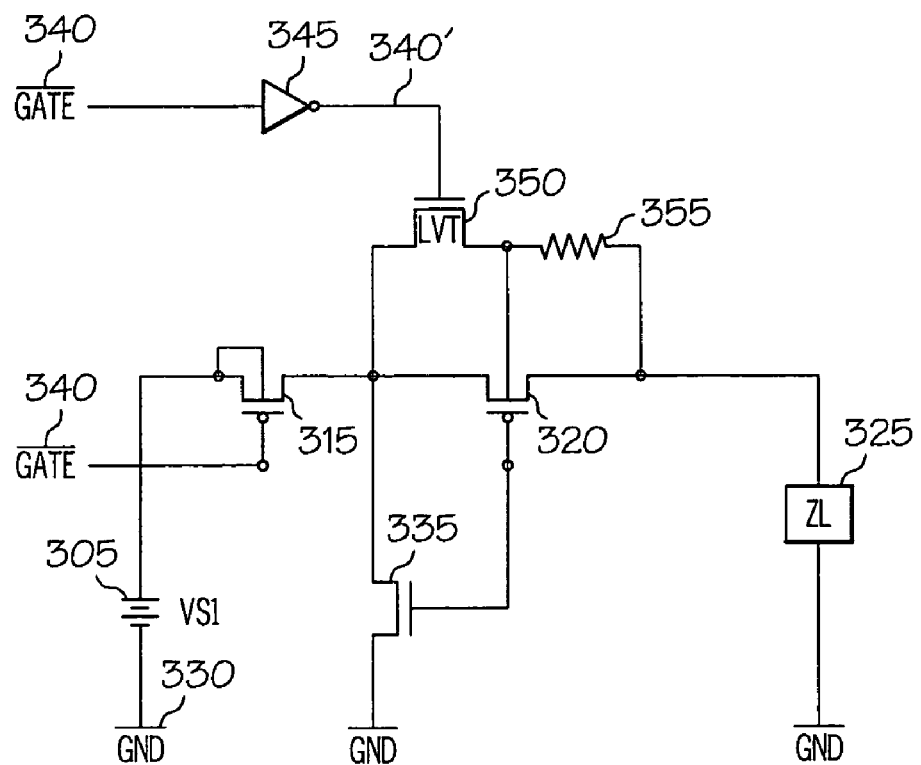

FIG. 3B illustrates the enhanced T-switch configuration of the invention. Enhanced T-switch 300 comprises many of the components found within a conventional T-switch design. Thus, enhanced T-switch 300 (referred to hereinafter as "eT-switch" for short) comprises switches made up of two P-channel CMOS transistors, switch1 transistor 315 and switch2 transistor 320, connected drain-to-drain in series with each other. The drain of N-channel transistor 335 connects at the drain-to-drain node of the two P-channel transistors.

As illustrated, primary supply (VS1) 305 is connected to load/impedance (ZL) 325 when corresponding switches (switch1 315 and switch2 320) are closed. Each reference leg of the circuit is connected to ground (GND) 330. In this illustration, impedance ZL 225 represents the load being powered by primary power supply 305. Each transistor receives a gate voltage input (Gate input) 340, which turns switch1 and switch2 transistors 315, 320 off while N-channel transistor 335 is on, and vice versa. In the illustrated embodiment, gate input 340 connects to gates of switch2 transistor 320 and N-channel transistor 335.

In addition to these conventional components, eT-switch 300 comprises a low voltage threshold (LVT) N-channel transistor 350 connected in series with pull up resistor 355. Source terminal of LVT transistor 350 is connected to drain-to-drain node between switch1 transistor 315 and switch2 transistor 320, while the drain terminal is connected to both pull up resistor 355 and the body of switch2 transistor 320. The gate of LVT transistor 350 is connected to gate input 340 through inverter 345. LVT transistor 350, pull up resistor 355 and inverted gate input 340' are added to T-switch configuration during fabrication of the wafer to allow the body connection of switch2 transistor 320 to be switched between drain and source diffusions without latchup, as described below.

Figure 5A:
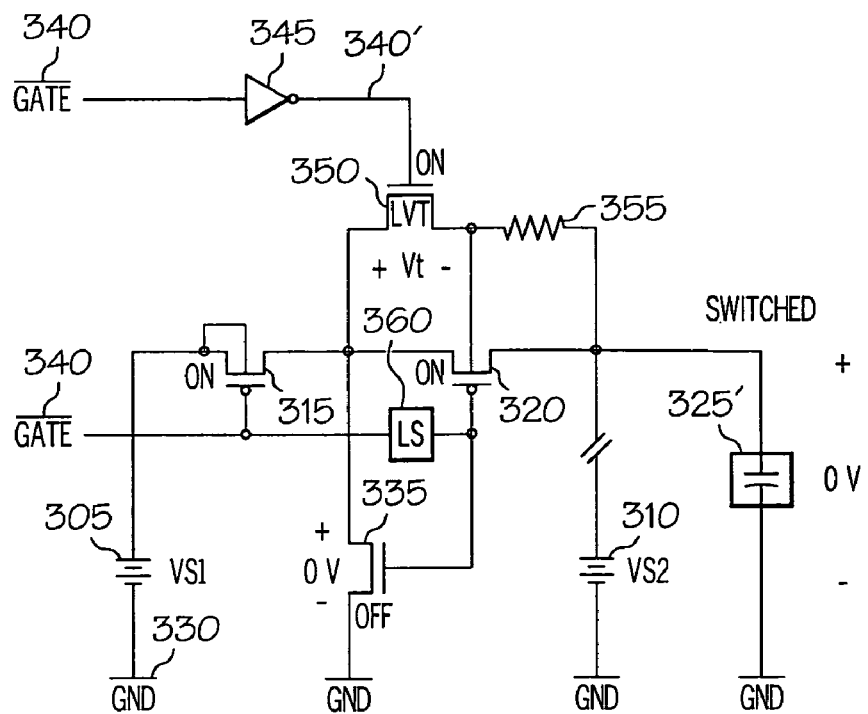
FIGS. 5A-5B illustrate the enhanced T-switch configuration of FIG. 3B in normal and switched mode, respectively, in accordance with embodiments of the invention.
Figure 5B:
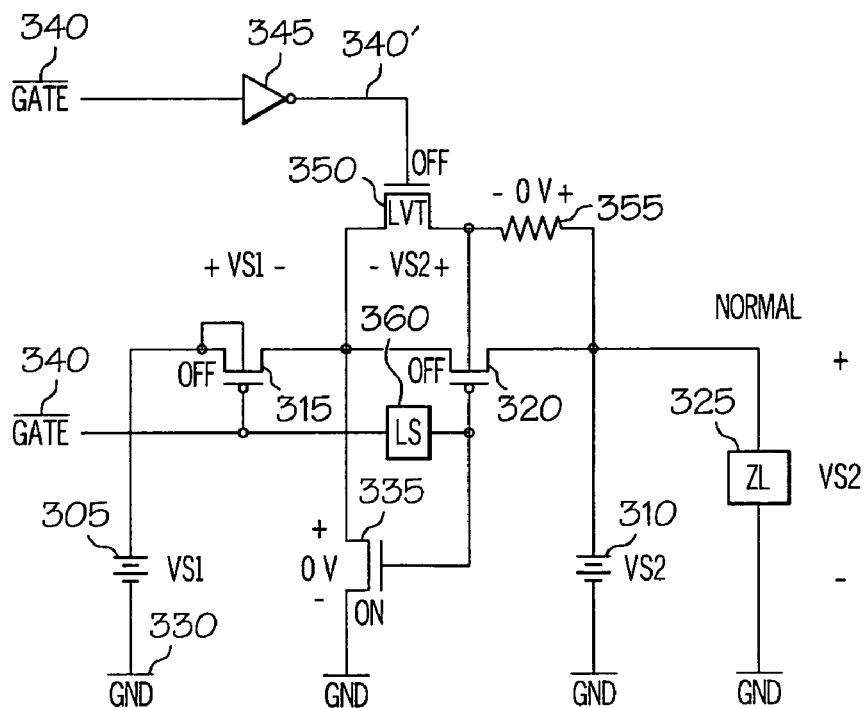

FIGS. 5A-5B illustrate the eT-switch during switched operation and normal operation, respectively. In both configurations, which now include a second power supply, VS2 310, gate input 340 is passed through level shifter (LS) 360 before connecting to gates of switch2 transistor 320 or N-channel transistor 335. LS 360 (i.e., DC level shifting of control signal) is utilized in some embodiments (but not necessarily required for implementation of the functional features of the invention) to make sure the logical high voltage received by the switch's input gate is the highest voltage potential node.

During normal state (FIG. 5B), LVT transistor 350 receives a low inverted gate input 340' (inverted from high gate input 340) and LVT transistor 350 is gated to "off" state. Also, pull up resistor 355 pulls the body connection of the switch2 transistor 320 to the highest diffusion potential. As shown by FIG. 5B, LVT transistor 350 is gated off, and pull-up resistor 355 pulls the body of switch2 transistor 320 to the diffusion connected to supply VS2 310. This potential represents the load side potential. Since switch1 transistor 315 drain diffusion is pulled to GND 330 through N-channel transistor 335, the voltage of VS2 310 is impressed across LVT transistor 350.

As shown by FIG. 5A, during switched state (i.e., at time of initial switching), LVT transistor 350 is gated "on" and switches the body connection of switch2 transistor 320 to the high-side diffusion potential. LVT transistor 350 is on and connects the body of switch2 transistor 320 to the diffusion potential on the side of power supply VS1 305. This potential represents the voltage potential of VS1 305. LVT transistor 350 remains on and connects the body of switch2 transistor 320 to the highest diffusion potential (as depicted) until the load capacitance (C) charges to approximately one threshold voltage (Vt) from VS1 305.

The invention thus provides a means for dynamically switching the body connection of a CMOS transistor switch to the highest potential diffusion (highest terminal potential), while achieving minimum forward biasing of the body/diffusion. This dynamic changing of the body connection directly depends on the state of the gate input 340.

As a final matter, it is important that while an illustrative embodiment of the present invention has been, and will continue to be, described in the context of a fully functional computer system with installed management software, those skilled in the art will appreciate that the software aspects of an illustrative embodiment of the present invention are capable of being distributed as a program product in a variety of forms, and that an illustrative embodiment of the present invention applies equally regardless of the particular type of signal bearing media used to actually carry out the distribution. Examples of signal bearing media include recordable type media such as floppy disks, hard disk drives, CD ROMs, and transmission type media such as digital and analogue communication links.

While the invention has been particularly shown and described with reference to a preferred embodiment, it will be understood by those skilled in the art that various changes in form and detail may be made therein without departing from the spirit and scope of the invention.

What is claimed is:

1. An electronic circuit device comprising:
   a switching transistor having a gate terminal, a voltage source side terminal and an output terminal;
   a load impedance coupled to the output terminal;
   a voltage source connected to the voltage source side terminal;
   a gate input that selectively turns the switching transistor on or off based on voltage potential of the gate input relative to a threshold voltage that is required for the switching transistor to turn on; and
      means for automatically and dynamically connecting a body of the switching transistor to a highest potential voltage among a first potential voltage at the voltage source side terminal and a second potential voltage at the output terminal, wherein said means for automatically and dynamically connecting the body comprises:
         a resistor connected at one terminal to the voltage source side terminal of the switching transistor and at a second terminal to a body node connected to the body of the switching transistor; and
         a low voltage threshold (LVT) transistor having a source terminal connected to the body node and its drain and gate terminals connected to the output terminal of the switching transistor.

2. The device of claim 1, wherein:
   the LVT transistor automatically turns on whenever the voltage potential across the load impedance is greater than the voltage potential at the voltage source side terminal;
   the LVT transistor pulls the potential of the body of the switching transistor to that of the output terminal when the LVT transistor is on; and
   the resistor pulls the potential of the body of the switching transistor to that of the voltage source side terminal when the LVT transistor is off.

3. The device of claim 1, wherein the LVT transistor is an N-channel transistor and wherein the switching transistor is a P-channel transistor.

4. The device of claim 1, wherein the voltage source is one of a voltage power supply or a signal source.

5. The device of claim 1, wherein the device is manufactured on a chip.

6. A method for fabricating an electronic circuit device, said method comprising:
   providing a switching transistor having a gate terminal, a voltage source side terminal and an output terminal;
   coupling a load impedance to the output terminal;
   connecting a voltage source to the voltage source side terminal;
   coupling a gate input to the gate terminal, wherein the gate input selectively turns the switching transistor on or off based on voltage potential of the gate input relative to a threshold voltage that is required for the switching transistor to turn on; and
      attaching a mechanism for automatically and dynamically connecting a body of the switching transistor to a highest potential voltage among a first potential voltage at the voltage source side terminal and a second potential voltage at the output terminal;
      wherein attaching a mechanism for automatically and dynamically connecting the body comprises:
         connecting a resistor between the voltage source side terminal of the switching transistor and at a body node connected to the body of the switching transistor; and
         connecting a source terminal of a low voltage threshold (LVT) transistor to the body node and both a drain and gate terminal of the LVT transistor to the output terminal of the switching transistor.

7. The method of claim 6, wherein:
   the LVT transistor automatically turns on whenever the voltage potential across the load impedance is greater than the voltage potential at the voltage source side terminal;
   the LVT transistor pulls the potential of the body of the switching transistor to that of the output terminal when the LVT transistor is on; and
   the resistor pulls the potential of the body of the switching transistor to that of the voltage source side terminal when the LVT transistor is off.

8. The method of claim 6, wherein the LVT transistor is an N-channel transistor and wherein the switching transistor is a P-channel transistor.

9. The method of claim 6, wherein the voltage source is one of a voltage power supply or a signal source.

10. The method of claim 6, wherein the device is fabricated on a chip.

11. An electrical circuit device comprising:
   a first voltage source;
   a load impedance;
   a gate input;

a first switching transistor having a source terminal connected to the first voltage source, a base terminal connected to the gate input and a drain connected to a transistor connecting node;

a second switching transistor having a source terminal connected to the load impedance, a base terminal connected to the gate input and a drain terminal connected to the transistor connecting node;

a pull down transistor having a source terminal connected to ground, a gate terminal connected to the gate input and a drain terminal connected to the transistor connecting node;

a mechanism for selectively connecting a body of the second switching transistor to a highest potential voltage among a first potential voltage at the transistor connecting node and a second potential voltage across the load impedance.

12. The device of claim 11, wherein said mechanism comprises:

a low voltage threshold (LVT) transistor connected at a source terminal to a body of the switching transistor, at its source terminal to the transistor connecting node, and at its gate terminal to an inverter gate output; and a resistor connected at one terminal to the source terminal of the second switching transistor and at a second terminal to a node connected to the body of the second switching transistor and the source terminal of the LVT transistor.

13. The device of claim 12, wherein:

the LVT transistor is selectively turned on by the inverted gate input whenever the first and second switching transistors are turned on such that the voltage potential of the body of the second switching transistor is the highest potential diffusion;

the LVT transistor is selectively turned off by the inverted gate input whenever the first and second switching transistors are turned off such that the voltage potential of the body of the second switching transistor is that impressed across the resistor, which is the highest potential diffusion when the switching transistors are turned off; and the resistor pulls the potential of the body of the second switching transistor to that of load impedance when the LVT transistor is off.

14. The device of claim 12, wherein the LVT transistor is an N-channel transistor and wherein the first and second switching transistors are P-channel transistors and the pull down transistor is an N-channel transistor.

15. The device of claim 11, wherein the voltage source is one of a voltage power supply or a signal source.

16. The device of claim 11, wherein the device is manufactured on a chip.

17. The device of claim 12, further comprising:

a level shifter (LS) coupled between gate input and the gate terminal of pull down transistor, said LS providing DC level shifting of a gate signal to provide a logical high voltage to the gate terminals of the second switching transistor and the pull down transistor that is the highest voltage potential node; and a second voltage source selectively connected across the load impedance when the first and second switching transistors are turned off, wherein the second voltage source also connects to the source terminal of the second switching transistor and one end of the resistor.

18. A method for fabricating a T-switch by connecting components according to the configuration provided by claim 12.

* * * * *